(12) United States Patent
Blackwell (10) Patent No.: US 7,625,250 B2
(45) Date of Patent: Dec. 1, 2009

(54) INTERLOCKING MODULES FOR HIGH PACKING RATIOS

(76) Inventor: Donald A. Blackwell, 19534 Vineyard La., Saratoga, CA (US) 95070-4556

( * ) Notice: Subject to any disclaimer, the term of this patent is extended or adjusted under 35 U.S.C. 154(b) by 0 days.

(21) Appl. No.: 11/419,709

(22) Filed: May 22, 2006

(65) Prior Publication Data
US 2006/0261015 A1 Nov. 23, 2006

Related U.S. Application Data

(60) Provisional application No. 60/684,003, filed on May 23, 2005.

(51) Int. Cl.
*H01R 9/22* (2006.01)
(52) U.S. Cl. ...................................... 439/717
(58) Field of Classification Search ................ 439/133, 439/594, 701, 715, 717; 312/263
See application file for complete search history.

(56) References Cited
U.S. PATENT DOCUMENTS 3,771,104 A * 11/1973 Clark .......................... 439/415
4,469,393 A * 9/1984 Chewning et al. ............ 439/717
4,480,745 A * 11/1984 Loge et al. ................ 211/85.26
5,785,537 A * 7/1998 Donahue et al. .............. 439/79
5,808,867 A * 9/1998 Wang .......................... 361/695
5,897,400 A * 4/1999 Amberg et al. ............... 439/717
6,033,268 A * 3/2000 Piper et al. ................... 439/715
6,126,492 A * 10/2000 Amberg et al. ............... 439/717
6,193,550 B1* 2/2001 Yamashita et al. ........... 439/594
6,332,813 B1* 12/2001 Okabe et al. ................. 439/701
6,428,126 B1* 8/2002 Poulter et al. ................ 312/263
6,881,100 B2* 4/2005 Barry et al. .................. 439/701
2004/0062014 A1* 4/2004 Erskine ....................... 361/752

* cited by examiner

*Primary Examiner*—Chandrika Prasad

(57) ABSTRACT

According to one example, a rack unit assembly is provided herein that includes a frame and a modular network component having at least one interlocking part associated therewith. The rack unit assembly also includes frame key mounted on the frame. The interlocking part is configured to be interlockingly coupled to the frame key.

20 Claims, 9 Drawing Sheets

INTERLOCKING MODULES FOR HIGH PACKING RATIOS

CROSS-REFERENCE TO RELATED APPLICATIONS

This application claims the benefit of U.S. Provisional Patent Application Ser. No. 60/684,003, filed May 23, 2005 and entitled INTERLOCKING MODULES FOR HIGH PACKING RATIOS, which application is incorporated herein by reference in its entirety.

BACKGROUND OF THE INVENTION

1. The Field of the Invention

The present invention relates to the field of network communications systems. More particularly, embodiments of the invention relate to an interlocking module that provides a high packing ratio of network components, such as network taps or other modular electrical or optical components, mounted on a rack.

2. The Relevant Technology

In recent years, it has become increasingly important to have the ability to monitor and analyze the data flow in communication channels between and within networks. Some of these reasons include monitoring the communication channel for certain types of data, identifying and diagnosing network problems, detecting interruptions in the communication channel, detecting degradation in the communication channel, and the like.

One of the tools used to monitor and analyze networks is a network tap. In general, a network tap is a device that enables network analyzers or other devices to have access to the data transmitted over the network. A tap typically provides a port that can be used to access the network. Once a tap is installed, network analyzers or other devices can access the network data without having to manipulate the network cable or altering the topology of the network. As networks proliferate, the need for more tap ports increases with large installations requiring hundreds if not a thousand or more taps or tap ports. Clearly, the physical space required to install these taps is at a premium.

Today, network equipment is typically mounted in standardized racks, the most common of which is called a 19 inch rack (named for its overall width). A standard 19" rack is divided up into vertical units called Rack Units (RU) each of which is 1.75" high. Maximizing the number of taps that can be installed in a 19" rack is a key factor in successful deployment of network tools.

A second consideration when deploying large numbers of taps is cost. Not only does each tap have to occupy minimal space, but each tap must be able to be delivered minimal cost. Conventionally, tap/rack densities of three single port units per RU were common, with higher densities achievable only through the use multi-port taps. Even with multi-port taps, densities greater than six ports per RU are difficult to achieve.

It would be advantageous to have a system for conveniently managing and storing a set of network tap modules. Any reduction in the space required for maintaining a set of network tap modules would be beneficial. In addition, such techniques for storing a set of network tap modules would also be applicable to any of a number of different types of electrical and optical cards or modules.

BRIEF SUMMARY OF THE INVENTION

These and other limitations are overcome by embodiments of the invention, which relate to rack unit assemblies. Rack unit assemblies are disclosed herein that include modular network components that have at least one interlocking part. The interlocking parts can form part of the housing or be mounted to the housing of the network components. The use of one or more interlocking parts with the modular network component allows for relatively high densities of the modular network components within a rack unit.

Accordingly, a first example embodiment of the invention is a rack unit assembly that includes a modular network component having at least one interlocking part associated therewith. The rack unit assembly also includes a frame having a frame key mounted thereon. The interlocking part of a network component is configured to be coupled to the frame key.

The interlocking part typically has a profile that can be configured to interlock with an opposite gender profile of an adjacent interlocking part on an adjacent network module. Alternatively, each of the adjacent network modules can have the same gender profile and a key can be used to couple or interlock the adjacent modules.

The rack unit assembly can have a generally horizontal configuration where network modules connect via the interlocking parts. Alternatively, the rack unit assembly can have a generally vertical configuration. In this case, multiple frame keys are mounted to a frame of the rack unit assembly. Each frame key can interlock with an interlocking part of corresponding network modules. In either case, the density is improved per rack unit.

These and other advantages and features of the present invention will become more fully apparent from the following description and appended claims, or may be learned by the practice of the invention as set forth hereinafter.

BRIEF DESCRIPTION OF THE DRAWINGS

To further clarify the advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. It is understood that the drawings are diagrammatic and schematic representations of presently preferred embodiments of the invention, and are not limiting of the present invention nor are they necessarily drawn to scale. The invention will be described and explained with additional specificity and detail through the use of the accompanying drawings in which.

DETAILED DESCRIPTION OF THE PREFERRED EMBODIMENTS

Devices, assemblies and methods are provided herein for increasing the density of modular network components that are located within and occupy a rack unit (RU) or that are mounted on a rack. According to one example, rack unit assemblies are provided herein that include modular network components coupled to a frame. The modular network components include at least one interlocking feature or part associated therewith. The interlocking parts allow for grouping the modular network components in a variety of configurations. For example, the modular network components may be oriented and grouped horizontally by coupling interlocking parts on one modular network component to interlocking features on one or more adjacent modular network components. Modular network components adjacent the frame may then in turn be coupled to keys which are secured to the frame. Restraining devices may be optionally used to further secure the modular network components to the frame.

Other rack unit assemblies are discussed wherein the modular network components are oriented vertically. According to one example, the frame includes a plurality of frame keys, wherein one or more of the network components are associated with each frame key to facilitate the vertical orientation of the modular network components to the frame. The modular network components may include traffic access ports (taps).

The use of interlocking features in a rack unit assembly increases the number of such taps, both single port and multi-port, that can be installed in one RU while minimizing the cost of not only the tap itself but also the cost of the system used to mount the taps in the rack. For example, rack units assemblies are discussed herein that achieve densities as high as 12 single ports per RU or higher and 16 ports per RU or higher in 4-port multi-port taps. These densities are achieved through the use of interlocking parts that allow the taps to be nested very tightly while maintaining a rigid and secure mounting arrangement. Examples of rack unit assemblies having vertically and horizontally oriented modular network components will be discussed in more detail below.

Figure 1:
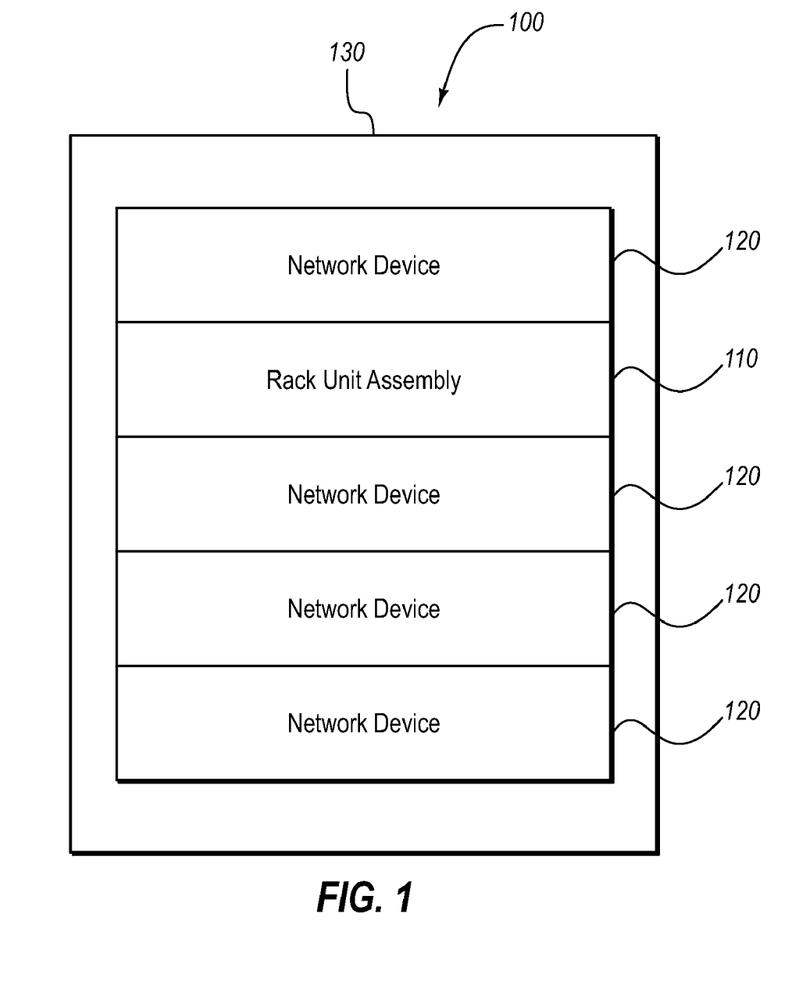
FIG. 1 is a schematic view of a network that includes a rack unit assembly having modular network components with interlocking parts.

FIG. 1 illustrates a rack unit assembly 110 used in a network 100. The The network 100 may be any type of network. For example, the network 100 may be a local area network (LAN), a wide area network (WAN), a storage area network (SAN), and/or any other type of network that includes network devices. In any case, the network 100 allows for communication between two or more network devices 120.

A number of the network devices 120 may be grouped together and mounted on a rack 130. For example, the rack 130 or cabinet is divided into a number of compartments having a standard size, such as 19" wide by 1.75" high. Each compartment may be referred to as a rack unit (RU). The network devices 120 may occupy any number of these rack units. For example, some network devices may occupy one, two or more rack units depending on their size.

In one example, a rack unit assembly 110 can be used to mount multiple network components. Embodiments of the invention enable the network components to be tightly and securely mounted in the rack unit assembly 110. The rack unit assembly 110 is also secured to the frame 130. According to one example, modular network components grouped with the rack unit assembly 110 provide access to connections between network devices 100. For example, the rack unit assembly 110 may include a plurality of traffic access ports (taps) that provide direct monitoring of the network traffic flowing through each link between network devices 110. Those of skill in the art will appreciate that other types of modular network components may be located in a grouped configuration within the rack unit assembly 110.

The rack unit assembly 110 is configured to occupy one or more rack units. Further, the rack unit assembly 110 provides high density grouping of modular network components per rack unit. Each rack unit assembly 110 includes at least one interlocking part associated with each of the modular network components. The interlocking parts may couple a modular network component to an adjacent device and/or to the frame of the rack unit assembly 110. Such a configuration may increase the density of such modular network components per rack unit. An exemplary modular network component having at least one interlocking part will now be discussed in more detail. Such a modular network component can be mounted to a frame of the rack unit assembly 110.

Figure 2A:
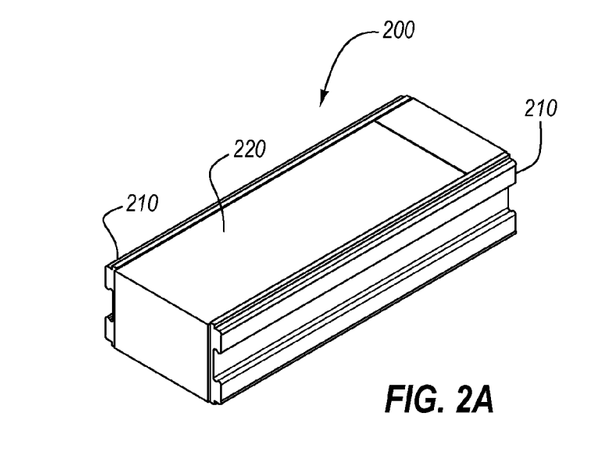
FIG. 2A is a perspective view of a modular network component having interlocking parts according to one example.

FIG. 2A illustrates a modular network component 200 having interlocking parts 210. The modular network component 200 includes a housing 220 that provides a framework for various electrical and/or optical components. The various inputs, outputs, and/or other components of the modular network component 200 have been omitted to focus on the configuration of the interlocking parts. Those of skill in the art will appreciate that any type of modular network component may have interlocking parts 210 coupled thereto or formed therewith.

Figure 2B:
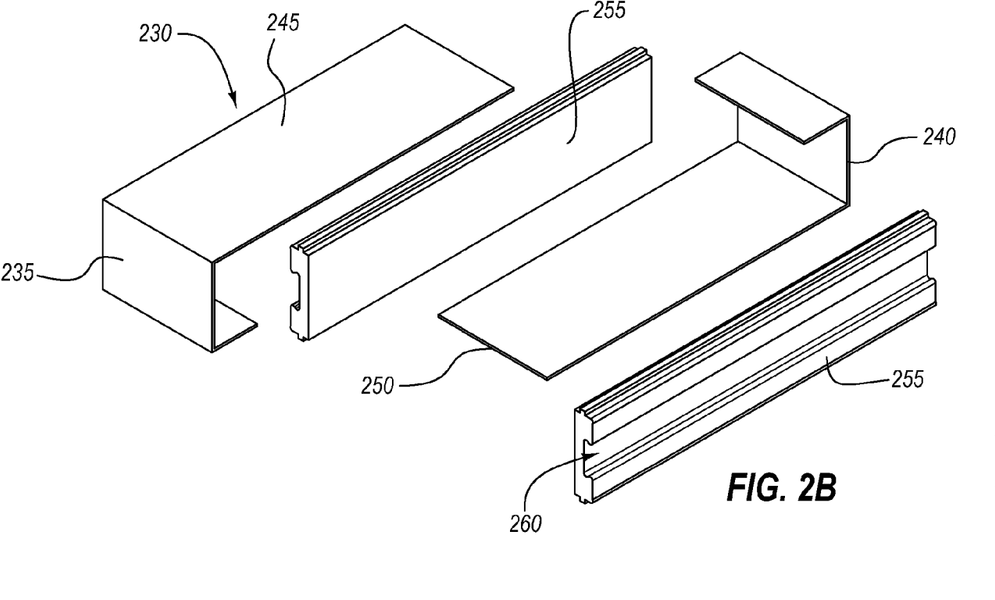
FIG. 2B is an exploded perspective view of a modular network component having interlocking parts according to one example.

FIG. 2B illustrates an exploded view of the modular network component 200. As seen in FIG. 2B, the housing may be formed of overlapping flaps 230 that when coupled together form four of the six surfaces of the modular network component. For ease of reference, these four surfaces will be referred to as the front 235, the back 240, the top 245, and the bottom 250 of the assembled modular network component 200 (FIG. 2A). The interlocking parts 210 form the sides of the assembled modular network component. Those of skill in the art will appreciate that these labels are applied for ease of reference only, and should not be construed to limit the disclosure to any one orientation or configuration. Further, the housing 220 can be formed in other configurations. For example, each of the four surfaces may be formed from a separate flap that is then connected to the other flaps.

The overlapping flaps 230 may be formed of any suitable material. According to one example, the overlapping flaps are formed of a metallic material, such as sheet metal. The overlapping flaps 230 may be cut and bent to the shape shown, using suitable techniques.

The interlocking parts 210 may be formed by any suitable process, including, without limitation, extrusion, casting, machining, or any combination of such processes. Further, the interlocking parts 210 may be formed of any suitable material, such as metallic materials, plastic materials, composite materials, or some combination of such materials. As introduced, the interlocking parts 210 according to the present example form the sides of the modular network component. Those of skill in the art will appreciate other configurations are possible in which interlocking parts 210 are separately provided and coupled to the housing 220.

Thus, the housing 220 is configured to receive the interlocking parts 210. The interlocking parts 210 thus form the sides of the network component. When the interlocking part 210 is connected to the housing 220, at least a portion f the interlocking parts 220 are disposed inside of the housing 220. When one network component is mounted adjacent another network component using the interlocking parts 210, the distance between the network components can be controlled by the configuration of the interlocking part 210. In the illustrated example, the distance is determined by a depth of a protrusion receiving profile 260.

The interlocking part 210 can form part of the housing 220, be mounted to edges of the housing 220, and the like. The interlocking part 210 on a first network component may have a first profile and the interlocking part 210 on an adjacent network component may have a second profile. In this example, the second profile effectively functions as a key to interlock the two network components.

The interlocking parts on adjacent network components can provide the support needed to mount multiple network components within a given rack unit assembly. A frame part, which is similar to an interlocking part 210, can be used to couple a network component to the frame in a similar manner that adjacent network components are interlocked with the interlocking parts. In this manner, the port density per rack unit is increased.

The interlocking parts 210 according to one example are single gender interlocking parts located along opposing sides of the modular network component 200. The interlocking parts 210 illustrated in FIG. 2A are female-type interlocking parts. Accordingly, each interlocking part 210 includes a protrusion receiving profile 260 formed therein. The protrusion receiving profile 260 is located on an outer portion of each of the interlocking parts 210, such that when the modular network component 200 is assembled, the protrusion receiving profile 260 is on the outside of the modular network component 200.

Figure 3:
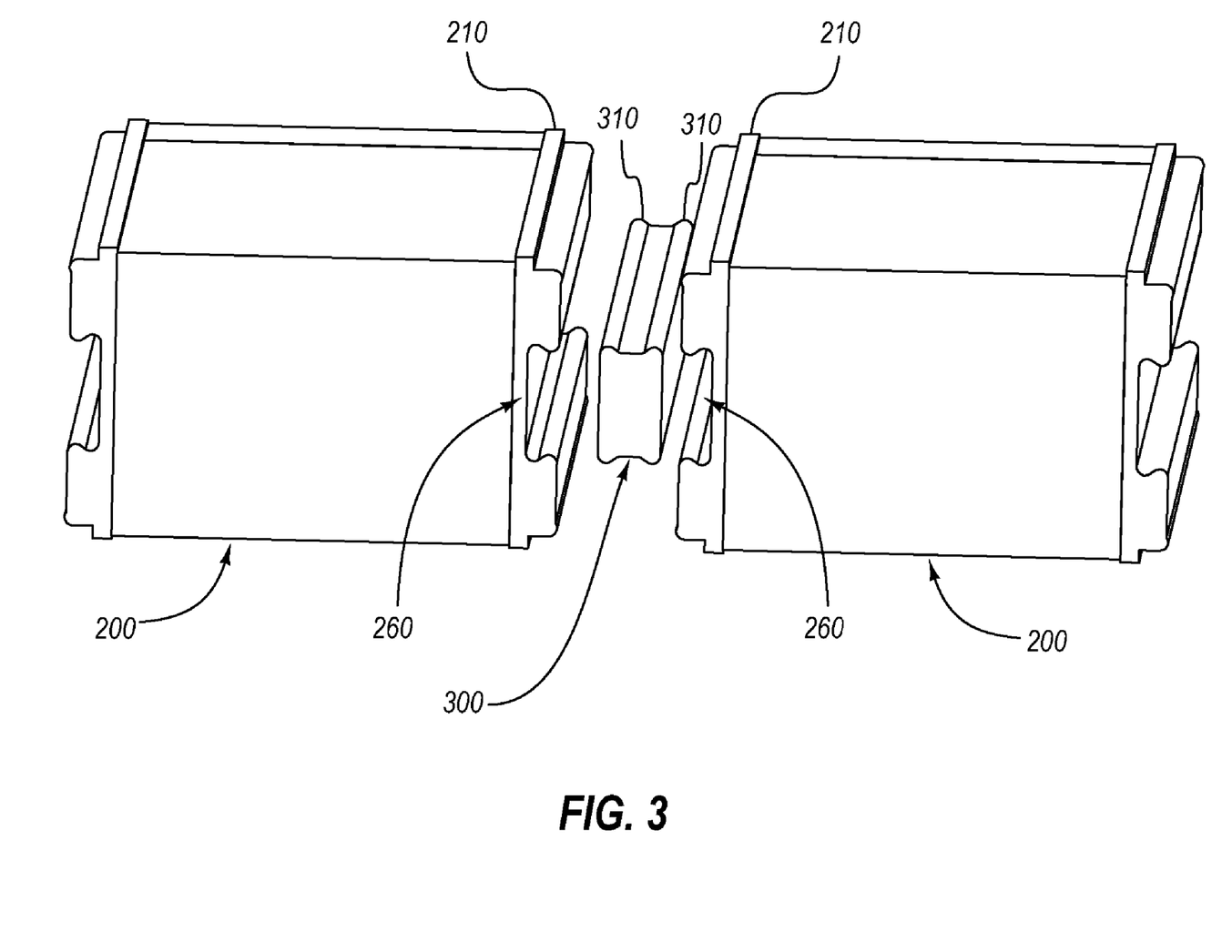
FIG. 3 is an exploded perspective view of an interlocking key and two modular network components having interlocking parts according to one example.

Additional components may be provided to couple one interlocking part 210 to one or more adjacent interlocking part 210, and thus couple one modular network component 220 to an adjacent modular network component. As seen in FIG. 3, an interlocking key 300 is provided that joins adjacent interlocking parts 210. The interlocking key 300 couples adjacent interlocking parts 210 by engaging the interlocking parts 210 of each modular network component. In particular, the interlocking key 300 may include opposing protrusions 310. These protrusions 310 may be slid into engagement with each of the protrusion receiving profiles 260. This interlocking configuration provides a rigid assembly that compactly joins the units and prevents the units from sliding apart.

The interlocking key 300 can be made from a different material than either or both of the interlocking parts 200 to provide ease of assembly with tight tolerance parts. This combination may include a plastic interlocking key with metal protrusion receiving profiles, a metal key with plastic protrusion receiving profiles or a soft metal interlocking key with harder metal protrusion receiving profiles, etc. The use of dissimilar materials may reduce the galling of surfaces that can occur when like materials are joined with a sliding action, especially with tight tolerance parts.

Figure 4:
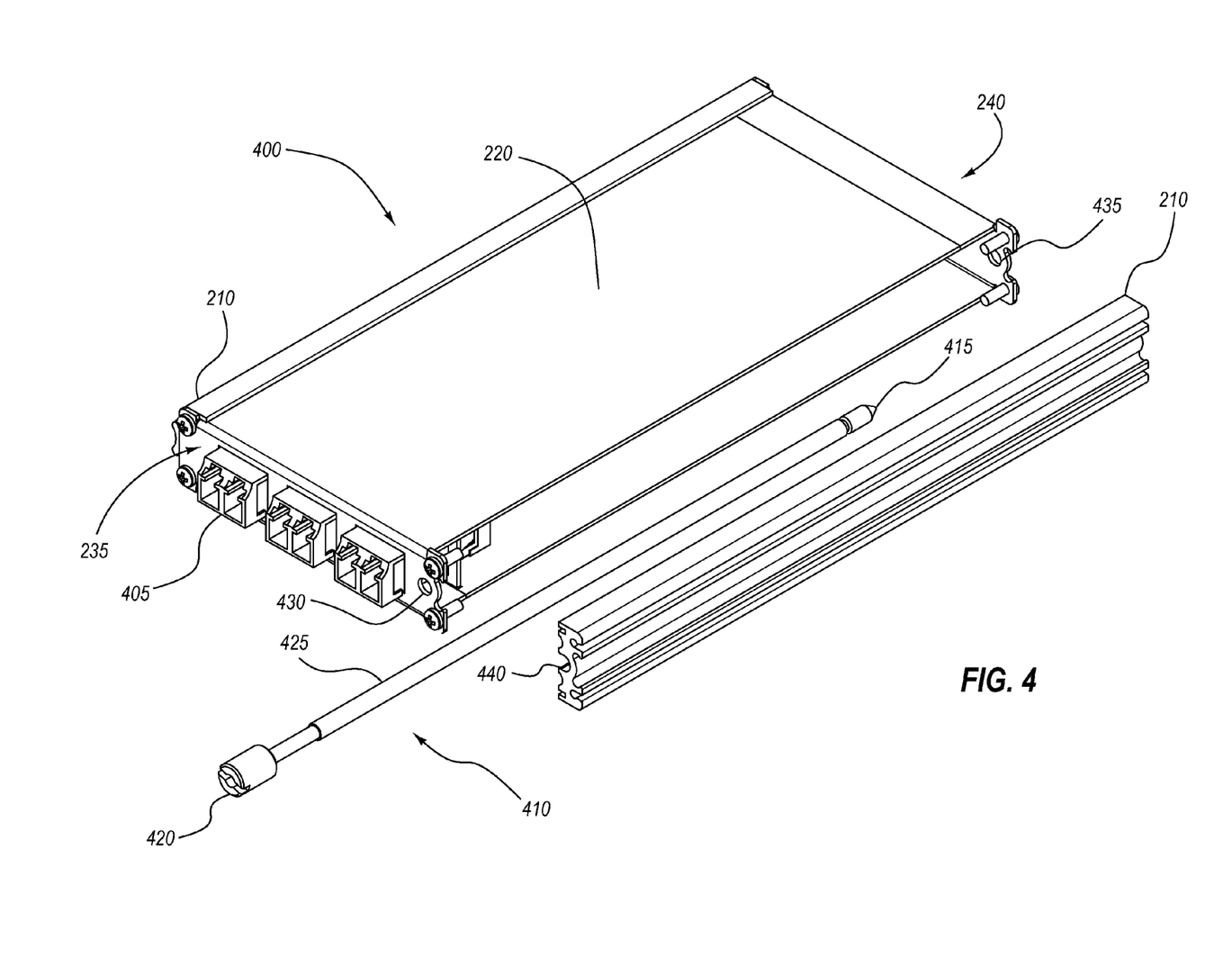
FIG. 4 is a perspective view of a traffic access port having interlocking features and a restraining device according to one example.
Figure 5:
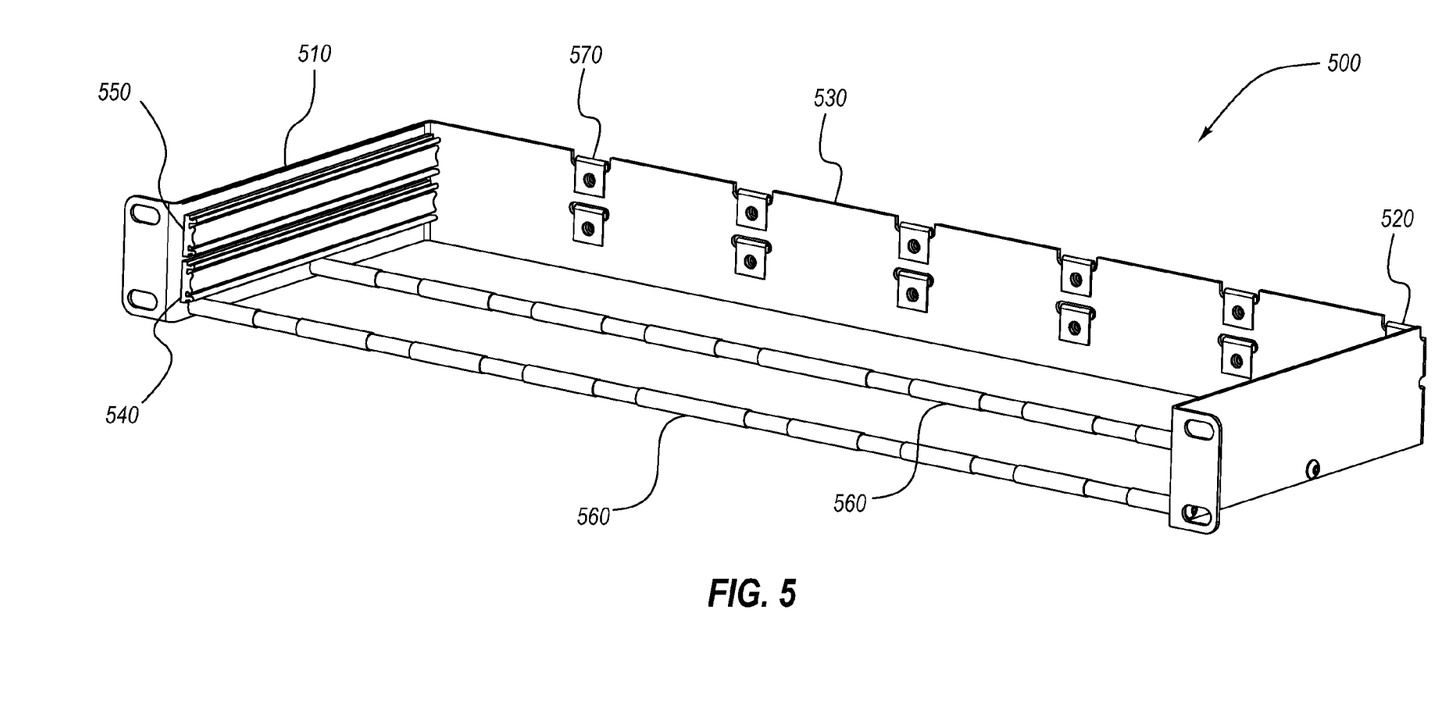
FIG. 5 is a perspective view of a frame according to one example.
Figure 6:
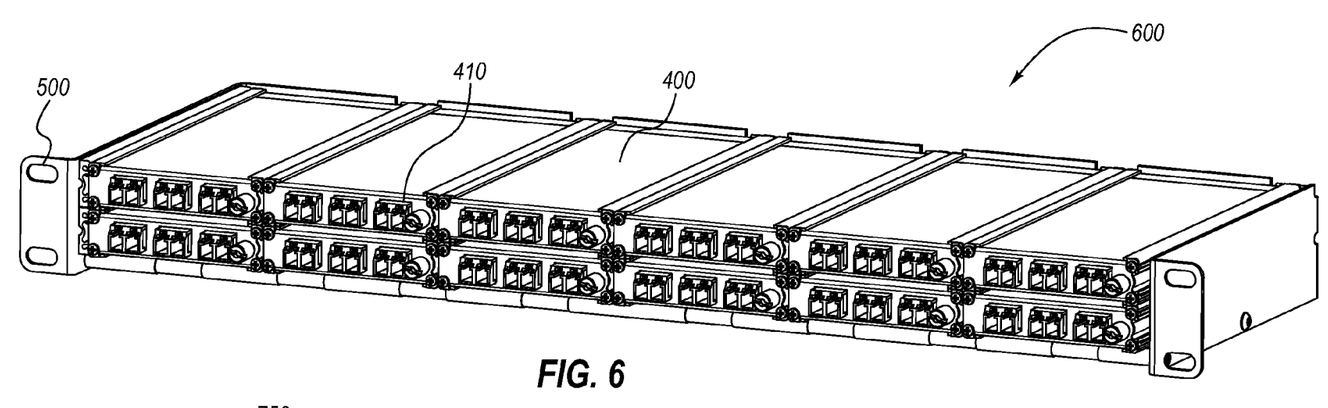
FIG. 6 is a perspective view of a rack unit assembly according to one example.

In addition to providing interlocking parts and interlocking keys for assembling modular network components, frames may be provided with keying features, supports, and optional restraining devices to further increase the density of modular network components within a rack unit assembly. One example of a rack unit assembly is shown in FIGS. 4-6. In particular, FIG. 4 illustrates an exploded perspective view of a tap 400 that includes interlocking parts 210 and a restraining device 410. The tap is 400 is an example of a network modular component that may be mounted in a rack unit assembly. FIG. 5 illustrates a frame 500 of a rack assembly unit and FIG. 6 illustrates the frame 500 with interlocking taps 400 assembled therein to form a rack unit assembly 600. The tap 400, the frame 500, and the rack unit assembly 600 will each now be discussed in more detail.

The tap 400 illustrated in FIG. 4 includes interlocking parts 210 and a housing 220, similar to those described above with reference to the modular network component 200. The tap 400 includes a plurality of ports 405. These ports include inlet and outlet ports for the traffic flowing through the link to which the tap 400 is connected. The tap 400 also includes outlet ports that provide a mirrored copy of the traffic flowing through tap 400. Thus, the tap 400 provides access to traffic flowing therethrough while minimizing the possibility that the traffic will be interrupted.

Additionally, a restraining device 410 is associated with the tap 400. The restraining device 410 may be used to reduce the possibility that the tap 400 will slide out of the frame 500 (FIG. 5) when mounted thereto. The restraining device 410 may be part of the tap or the frame 500. For ease of reference, the restraining device 410 will be discussed as being a threaded rod that is mounted to the tap 400 and is then secured to the frame 500.

More specifically, the restraining device 410 includes a frame engagement end 415, a knob 420, and a shaft 425 extended therebetween. According to the example shown in FIG. 4, the restraining device 410 is configured to pass through both the housing 220 and the interlocking part 210, although the restraining device 410 may pass through either the housing 20 or the interlocking part 210. In this example, holes 430, 435 are defined in the front 235 and the rear 240 of the housing 220 respectively. A channel 440 is formed in the interior portion of the interlocking part 210. When the restraining device 410 is coupled to the tap 400, the frame engagement end 415 extends beyond the rear 240 of the housing 220 while the shaft 425 passes through the hole 430 in the front 235 of the housing, through the channel 440 formed in the interlocking part 210, and through the hole 435 defined in the rear 240 of the housing 220. The knob 420 remains at least partially outside of the housing 220, such as at a location near the front 235.

The frame engagement end 415 is configured to engage a corresponding feature in the frame 500 (FIG. 5). For example, the frame engagement end 415 may have threads formed thereon to engaged threads formed in the frame 500 (FIG. 5). Thus, rotating the knob 420 rotates the shaft 425 and the frame engagement end 415, thereby allowing a user to secure the tap 400 to the frame 500. Other restraining devices may be used to secure the tap 400 to the frame 500, such as restraining devices that include a twist lock, a tab lock or a detent type device.

FIG. 5 illustrates the frame 500 in more detail. The frame 500 includes side members 510, 520 as well as a rear member 530. Such labels are used for ease of reference only. According to the present example, at least one of the side members 510, 520 has at least one keying assembly 540 coupled thereto.

According to the example shown, the keying assembly 540 is connected to the side member 510 and includes a plurality of frame keys 550 that are of the opposite gender as the interlocking part 210 that is to be engaged thereby. More specifically, the frame keys shown in FIG. 5 are configured to interface with female-type interconnecting parts. As such, the key assembly 540 includes male-type keys 550 configured to engage the protrusion receiving profiles 260 (FIG. 2A) associated with the taps 400 (FIG. 4). While male-type frame keys 550 have been discussed, those of skill in the art will appreciate that any configuration may be used to secure at least one end of at least one modular network component such as the tap 400 to the frame 500. Thus, the interlocking parts 2310 may have a male receiving profile and the key assembly may have a corresponding female key 550.

The frame 500 according to the present example also includes supports 560. The supports 560 extend between the side members 510, 520. The supports 560 provide additional support for taps 400 (FIG. 4) or other modular network components coupled to the frame 500. Additionally, as introduced, the restraining device 410 (FIG. 4) is configured to secure the tap 400 (FIG. 4) to the frame 500. In this manner, the restraining device 410 can also provide additional support for the taps 400 or other network components. Accordingly, the frame 500 includes restraining device interfaces 570 associated therewith. The restraining device interfaces 570 may include a threaded tab that is configured to engage the frame engaging end 415 of the restraining device 410 (FIG. 4). When one or more retraining devices 410 (FIG. 4) engage the restraining device interfaces 570, the tap or taps associated with that restraining device 410 are thereby further secured to the frame 500.

FIG. 6 illustrates taps 400 secured to the frame 500 to form the rack unit assembly 600. As seen in FIG. 6, the taps 400 are grouped in two horizontal rows with six individual taps 400 per row. The rack unit assembly 600 thus includes twelve taps in a single standard sized rack unit (RU), for a density of twelve taps per rack unit. The ends of each row according to the present example are each coupled to keying assemblies 540 coupled to each of the side members 510, 520. Additionally, each tap 400 includes a restraining device 410 associated therewith. Those of skill in the art will appreciate that other configurations are possible that include ratios of taps to restraining devices of greater or less than 1:1. Still other configurations are possible that include vertically oriented modular network components.

Figure 7:
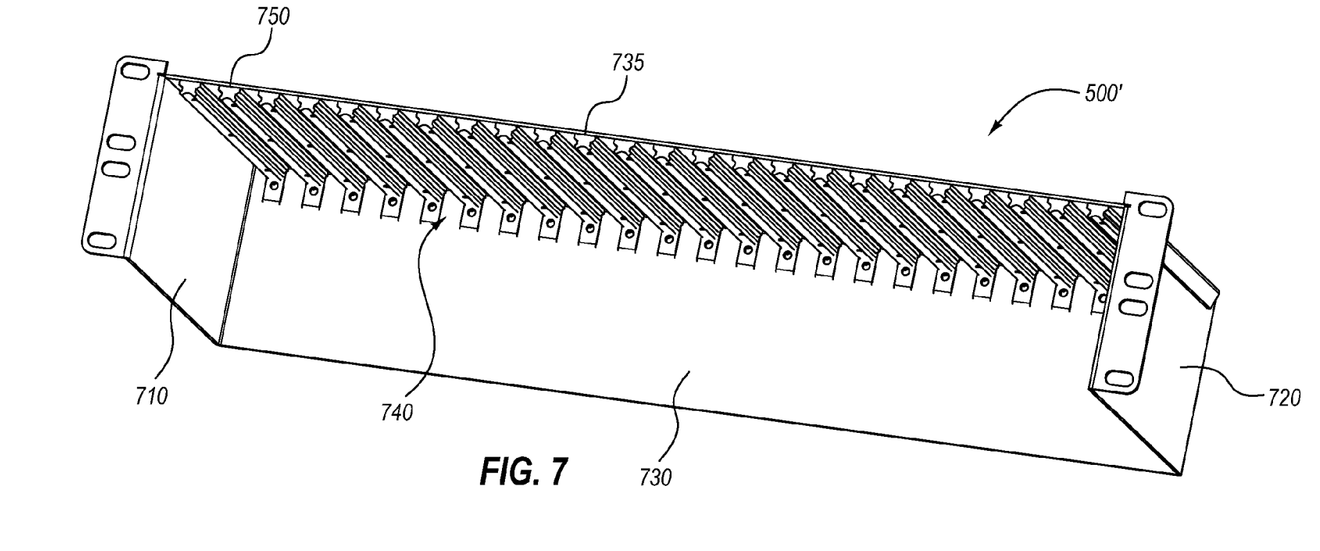
FIG. 7 is a perspective view of a rack unit frame according to one example.

FIG. 7 illustrates a frame 500' configured to receive vertically oriented modular network components, such as taps 400 (FIG. 4). The frame 500' includes side members 710, 720; a rear member 730; and a top member 735. A keying assembly 740 is coupled to the top member 735. The keying assembly 740 includes a plurality of frame keys 750. In a similar fashion to the horizontally oriented rack unit assembly 600 (FIG. 6) previously discussed, the frame keys 750 are of the opposite gender as the interlocking parts 210 that are engaged thereby. Consequently, the frame keys 750 shown in FIG. 7 are male-type frame keys configured to interface with female-type interconnecting parts. While male-type frame keys 750 have been discussed, those of skill in the art will appreciate that any configuration may be used to secure at least one end of at least one modular network component such as the tap to a frame 500'.

Figure 8:
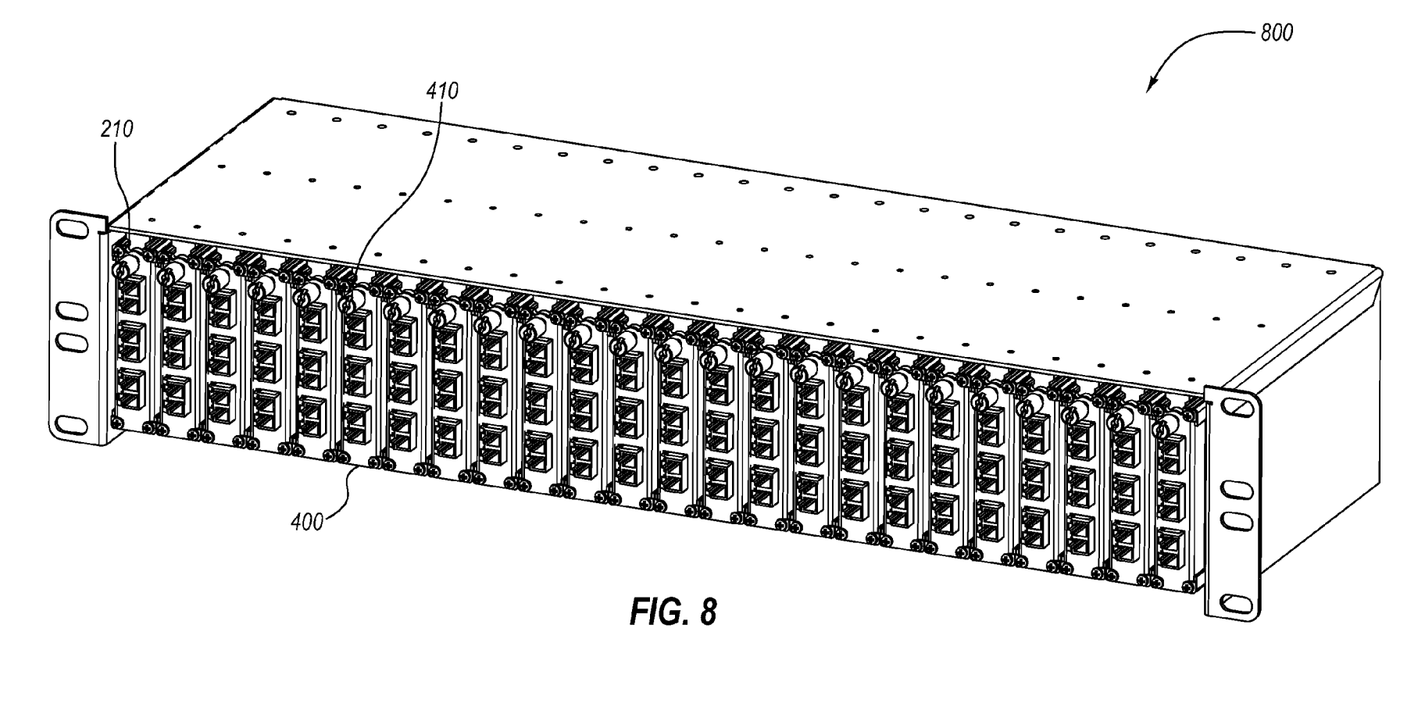
FIG. 8 is a frontal view of a rack unit assembly according to one example.

FIG. 8 illustrates a rack unit assembly 800 wherein a plurality of taps 400 are coupled to the frame 500'. The taps 400 are oriented in a generally vertical arrangement. In this orientation, each tap 400 includes an interlocking part 210 on the top portion of the tap 400, which is rotated relative to the orientation shown in FIG. 4. The interlocking parts 210 engage a frame key 750 within the keying assembly 740 to thereby couple the taps 400 to the frame 500' as previously discussed.

A number of restraining devices 410 couple one or more taps 400 to the frame 500'. In such a configuration, the rack unit assembly 400 provides a high density of taps per rack unit. In particular, as illustrated in FIG. 8, the rack unit assembly 400 includes 24 taps coupled to the frame 500'. The frame 500' occupies two rack units (RU's), such that the density of the rack unit assembly 800 is twelve taps 400 per rack unit, in this example.

The rack unit assembly 800 includes the taps 400 coupled to a single keying assembly located at the top of the rack 500'. Thus far, single taps have been discussed with reference to the rack unit assemblies. Other configurations are possible that include multi-port modular network components, such as multi-port taps.

Figure 9:
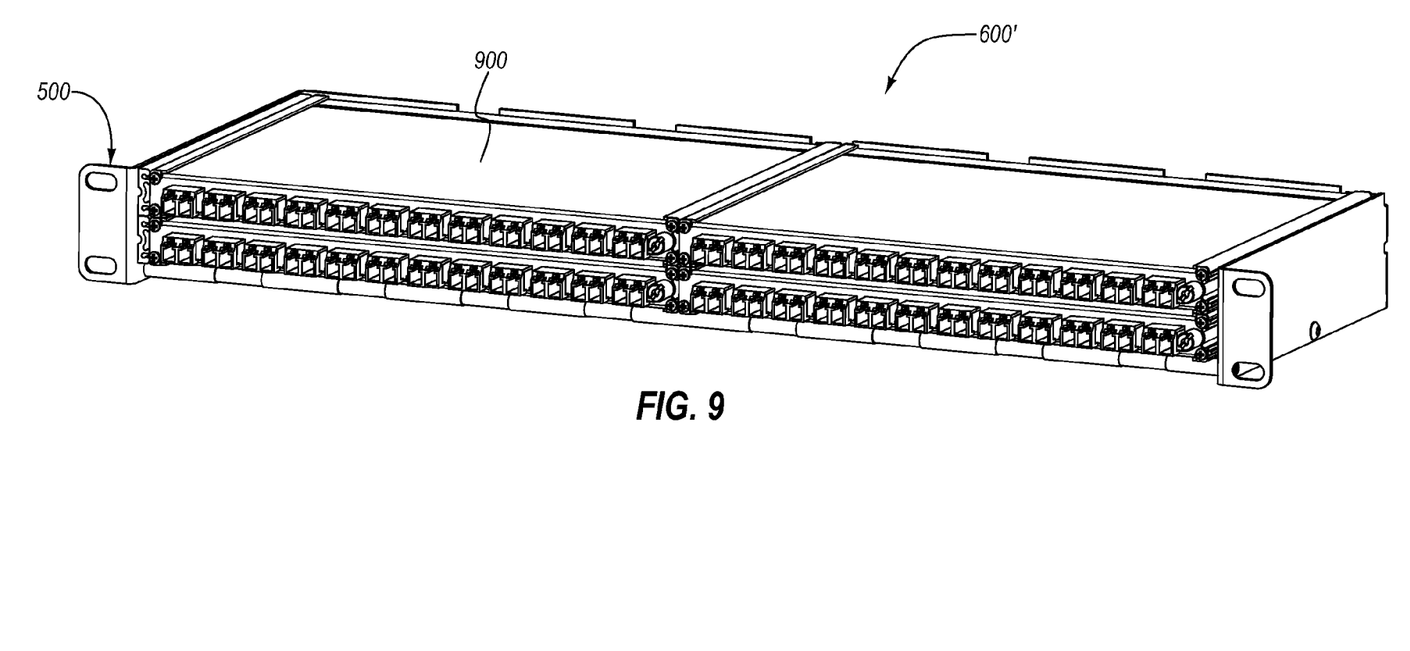
FIG. 9 is a perspective view of a rack unit assembly that includes interlined multi-port taps according to one example.

In particular, FIG. 9 illustrates a multi-port tap 900 that includes an interlocking part 210 associated therewith. The multi-port tap 900 shown may be formed as discussed above or otherwise. Multi-port tap 900 may then be coupled to a frame 500 to form a rack unit assembly 600', as shown in FIG. 9. The multi-port tap 900 shown is a four port tap. The frame 500 shown occupies a single RU, such that the rack unit assembly 600' has a tap density of sixteen taps per RU. Accordingly, multi-port or otherwise clustered modular network components may be grouped and coupled to a rack using interlocking parts to provide a rack unit assembly 600' having a relatively high density of modular network components.

Figure 10:
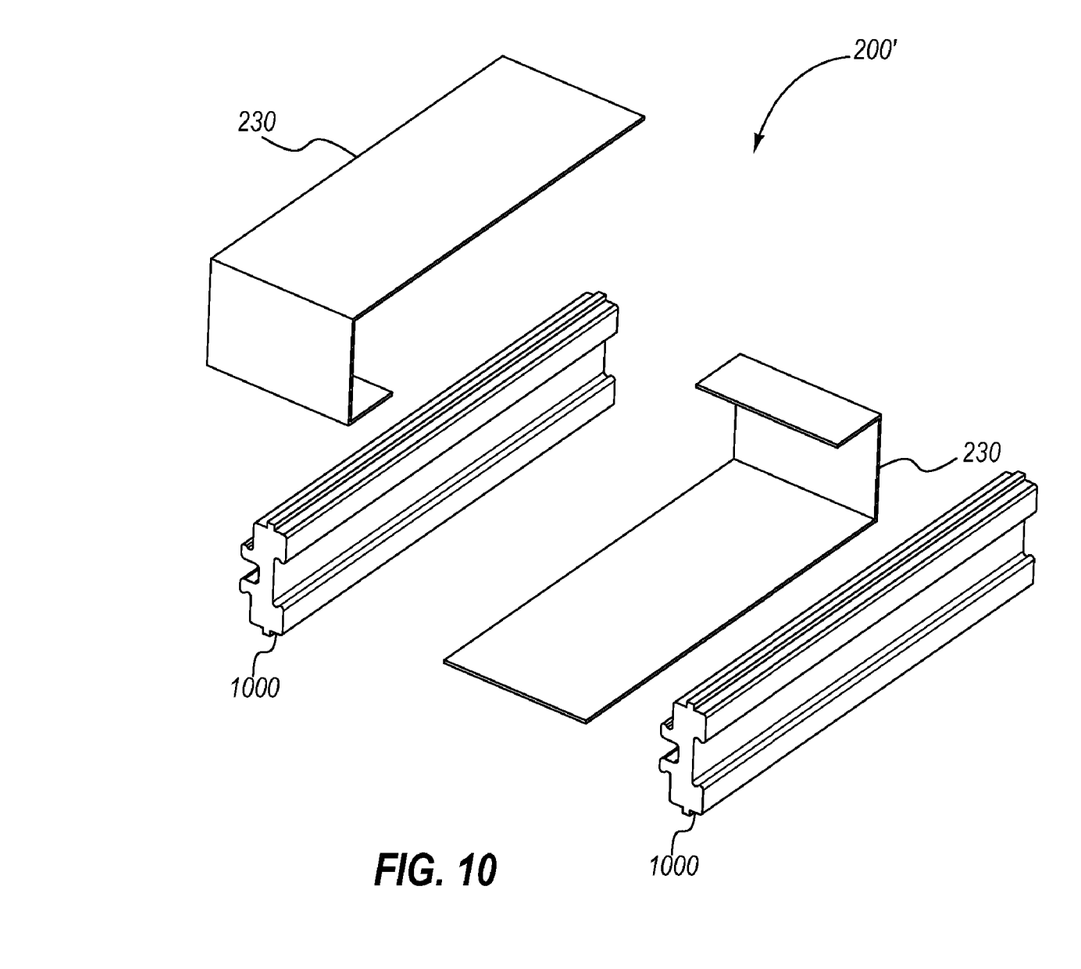
FIG. 10 illustrates a perspective view of a modular network component having interlocking features according to one example.

To this point, single gender interlocking parts have been discussed herein that are coupled together using one or more interlocking keys. Additional configurations are possible. For example, interlocking parts of both genders may be used together, such that a male-type interlocking part may be coupled to a female-type interlocking part. Further, a modular network component 200' may include a single shape for an interlocking part 1000 that incorporates both the male and female features, as shown in FIG. 10. As seen in FIG. 10, the interlocking part 1000 is seated in the sides of the housing formed by overlapping flaps 230 in a similar fashion as the interlocking parts 210 discussed above.

In conclusion, modular network components have been discussed herein that include at least one interlocking part. The interlocking parts may be coupled to interlocking parts on one or more adjacent modular network components and/or to frame keys secured to a frame. Such a configuration may increase the relative density of modular network components that occupy a rack unit.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A rack assembly, comprising:
   a first modular network component including opposing sides defined by a first interlocking part and a second interlocking part, wherein said first and second interlocking parts comprise single gender-type interlocking parts;
   a second modular network component including opposing sides defined by a third interlocking part and a fourth interlocking part, wherein said third and fourth interlocking parts comprise single gender-type interlocking parts, wherein the second modular component is horizontally disposed adjacent to the first modular network component;

a frame including a first frame key secured to an interior surface of the frame, wherein said first interlocking part is configured to interlock with said first frame key thereby supporting the first modular network component within the frame;

at least one interlocking key disposed between the first and second modular components, the at least one key being configured to be received by the second interlocking part of the first modular network component and the third interlocking part of the second modular network component, the interlocking key having symmetrical interlocking features on directly opposing locations of directly opposing sides of the interlocking key;

a first restraining device configured to secure said first modular network component to said frame such that the restraining device must be released from the frame prior to removal of the first modular network component; and a second restraining device configured to secure said second modular network component to said frame such that the restraining device must be released from the frame prior to removal of the second modular network component, wherein the first modular network component provides vertical support to the second modular network component via the at least one interlocking key.

2. The assembly of claim 1, wherein said first modular network component comprises a traffic access port.

3. The assembly of claim 2, wherein said traffic access port includes at least one of a single port traffic access port and a multi-port traffic access port.

4. The assembly of claim 1, wherein said first modular network component is oriented generally horizontally relative to said frame.

5. The assembly of claim 1, wherein said first interlocking part comprises a female-type interlocking part.

6. A rack unit assembly, comprising:

a first modular network component including a first interlocking part on a first side of the first modular network component, a second interlocking part on a second side of the first modular network component, and a housing, the interlocking parts including interlocking slots or protrusions running from a front of the first modular network component where ports are located to a rear of the first modular network component;

a second modular network component including a first interlocking part on a first side of the second modular network component, a second interlocking part on a second side of the second modular network component, and a housing, the interlocking parts of the second modular network component including interlocking slots or protrusions running from a front of the second modular network component where ports are located to a rear of the second modular network component, wherein the first modular network component is disposed laterally adjacent to the second modular network component; and an interlocking key disposed between the first and second modular network components, the interlocking key including at least partially curved protrusions on directly opposing sides of the interlocking key configured to interlock and be substantially contained within a void created when said first interlocking part of the second modular network component abuts said second interlocking part of the first modular network component so as to provide vertical support to the first and second modular network components, wherein said interlocking key is made of a different material than at least one of said first interlocking part of the second modular network component and the second interlocking part of the first modular network component.

7. The assembly of claim 6, wherein said first interlocking part and said second interlocking part comprise single gender-type interlocking parts.

8. The assembly of claim 7, wherein said single gender-type interlocking parts comprise female-type interlocking parts.

9. The assembly of claim 6, wherein said interlocking key is integral to at least one of said first interlocking part and said second interlocking part.

10. The assembly of claim 6, further comprising a frame, said frame having at least one frame key configured to engage at least one of said interlocking parts.

11. The assembly of claim 1, wherein the first interlocking part extends along a first side of the modular network component such that the first interlocking part engages the frame key when the modular network component is inserted into the frame.

12. The assembly of claim 1, wherein the restraining device extends through a hole in a front end of the modular network component, through a channel in a second interlocking part, and through a hole in a back end of the modular network component.

13. The assembly of claim 1, wherein each modular network component is constrained by a single restraining device that extends through a hole in the front end of the modular network component, through a channel in the female-gender interlocking part, through a hole in the back end of the modular network component and secures to a rear member of the frame.

14. The assembly of claim 1, wherein said first, second, third, and fourth interlocking parts comprise female-type interlocking parts and the at least one interlocking key includes two male-type interlocking parts interlocked with the second and third female-type interlocking parts.

15. The assembly of claim 14, wherein the first frame key comprises a male-type interlocking part interlocked with the first female-type interlocking part.

16. The assembly of claim 6, wherein the interlocking key is not permanently affixed to the frame.

17. A rack assembly, comprising:

a first modular network component including opposing sides defined by a first male-type interlocking part and a first female-type interlocking part;

a second modular network component disposed adjacent to the first module network component, the second modular network component including opposing sides defined by a second male-type interlocking part and a second female-type interlocking part, wherein the first female-type interlocking part of the first modular network component configured to directly interlock with the second male-type interlocking part of the second modular network component such that the first and second modular network components are directly interlocked in a side-by-side configuration;

a frame including a first female-type frame key, wherein said first male-type interlocking part of the first modular network component is configured to interlock with said first female frame key thereby supporting the first modular network component within the frame; and a first restraining device configured to secure said first modular network component to a rear member of said frame such that the restraining device must be released from the frame prior to removal of the first modular network component; and a second restraining device configured to secure said second modular network component to the rear member of said frame such that the second restraining device must be released from the frame prior to removal of the second modular network component.

18. The assembly of claim 17, further comprising:

a third modular network component disposed adjacent to the second modular network component, the third modular network component including opposing sides defined by a third male-type interlocking part and a third female-type interlocking part, wherein the second female-type interlocking part of the second modular network component is configured to directly interlock with the third male-type interlocking part of the third modular network component such that the second and third modular network components are directly interlocked in a side-by-side configuration; and a third restraining device configured to secure said third modular network component to the rear member of said frame such that the third restraining device must be released from the frame prior to removal of the third modular network component.

19. The assembly of claim 17, wherein only a single restraining device is used to prevent removal of each modular network component.

20. The assembly of claim 19, wherein each restraining device extends through a hole in the front end of the modular network component, through a channel in the female-gender interlocking part, through a hole in the back end of the modular network component and secures to a rear member of the frame.

* * * * *